US008525569B2

(12) United States Patent  
Bucelot et al.

(10) Patent No.: US 8,525,569 B2
(45) Date of Patent: Sep. 3, 2013

(54) SYNCHRONIZING GLOBAL CLOCKS IN 3D STACKS OF INTEGRATED CIRCUITS BY SHORTING THE CLOCK NETWORK

(75) Inventors: Thomas J. Bucelot, Wappingers Falls, NY (US); Liang-Teck Pang, White Plains, NY (US); Phillip J. Restle, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 13/217,335

(22) Filed: Aug. 25, 2011

(65) Prior Publication Data

US 2013/0049827 A1 Feb. 28, 2013

(51) Int. Cl.
*G06F 1/04* (2006.01)

(52) U.S. Cl.
USPC .......... 327/293; 327/291; 327/415; 327/565; 257/777; 257/778

(58) Field of Classification Search
USPC .................. 327/295, 415, 565; 257/778, 777
See application file for complete search history.

(56) References Cited

U.S. PATENT DOCUMENTS

| | | |
|---|---|---|
| 4,868,712 A | 9/1989 | Woodman |
| 5,200,631 A | 4/1993 | Austin et al. |
| 5,280,184 A | 1/1994 | Jokerst et al. |
| 5,655,290 A | 8/1997 | Moresco et al. |
| 5,702,984 A | 12/1997 | Bertin et al. |
| 6,141,245 A | 10/2000 | Bertin et al. |
| 6,258,623 B1 | 7/2001 | Moden et al. |
| 6,569,762 B2 | 5/2003 | Kong |
| 6,982,869 B2 | 1/2006 | Larson |
| 7,021,520 B2 | 4/2006 | Bowen |
| 7,030,486 B1 | 4/2006 | Marshall |
| 7,067,910 B2 | 6/2006 | Drost et al. |
| 7,521,950 B2 | 4/2009 | Bernstein et al. |
| 7,615,869 B2 | 11/2009 | Koo et al. |
| 7,623,398 B2 | 11/2009 | Arai |

(Continued)

FOREIGN PATENT DOCUMENTS

FR 2946182 A1 12/2010

OTHER PUBLICATIONS

Badaroglu et al., "Clock-skew-optimization methodology for substrate-noise reduction with supply-current folding" ICCAD, vol. 25. No. 6, pp. 1146-1154, Jun. 2006.

(Continued)

*Primary Examiner* — Ryan Jager
(74) *Attorney, Agent, or Firm* — Tutunjian & Bitetto, P.C.; Louis J. Percello (57) ABSTRACT

There is provided a clock distribution network for synchronizing global clock signals within a 3D chip stack having two or more strata. On each of the two or more strata, the clock distribution network includes a clock grid having a plurality of sectors for providing the global clock signals to various chip locations, a multiple-level buffered clock tree for driving the clock grid and including at least a root and a plurality of clock buffers, and one or more multiplexers for providing the global clock signals to at least a portion of the buffered clock tree. Inputs of at least some of the plurality of clock buffers on each of the two or more strata are shorted together using chip-to-chip interconnects to reduce skewing of the global clock signals with respect to the various chip locations.

25 Claims, 10 Drawing Sheets

(56) References Cited

U.S. PATENT DOCUMENTS

| | | | |
|---|---|---|---|
| 7,701,251 | B1 | 4/2010 | Rahman et al. |
| 7,710,329 | B2 | 5/2010 | Chiozzi |
| 7,753,779 | B2 | 7/2010 | Shayesteh |
| 7,768,790 | B2 | 8/2010 | Kuroda et al. |
| 7,772,708 | B2 | 8/2010 | Leddige et al. |
| 7,830,692 | B2 * | 11/2010 | Chung et al. ............ 365/51 |
| 7,863,960 | B2 | 1/2011 | Wang et al. |
| 2002/0089831 | A1 | 7/2002 | Forthun |
| 2004/0177237 | A1 | 9/2004 | Huppenthal et al. |
| 2005/0058128 | A1 | 3/2005 | Carson et al. |
| 2006/0043598 | A1 | 3/2006 | Kirby et al. |
| 2007/0033562 | A1 | 2/2007 | Correale et al. |
| 2007/0047284 | A1 | 3/2007 | Silvestri |
| 2007/0132070 | A1 * | 6/2007 | V. Buot et al. .......... 257/662 |
| 2007/0287224 | A1 | 12/2007 | Alam et al. |
| 2007/0290333 | A1 | 12/2007 | Saini et al. |
| 2008/0068039 | A1 * | 3/2008 | Bernstein et al. ........ 326/16 |
| 2008/0204091 | A1 * | 8/2008 | Choo et al. ............. 327/149 |
| 2009/0024789 | A1 | 1/2009 | Rajan et al. |
| 2009/0055789 | A1 | 2/2009 | McIlrath |
| 2009/0064058 | A1 | 3/2009 | McIlrath |
| 2009/0070549 | A1 | 3/2009 | Solomon |
| 2009/0070721 | A1 | 3/2009 | Solomon |
| 2009/0168860 | A1 | 7/2009 | Magagni et al. |
| 2009/0196312 | A1 | 8/2009 | Kuroda |
| 2009/0237970 | A1 | 9/2009 | Chung |
| 2009/0245445 | A1 | 10/2009 | Saen et al. |
| 2009/0323456 | A1 | 12/2009 | Gomm |
| 2010/0001379 | A1 | 1/2010 | Lee et al. |
| 2010/0005437 | A1 | 1/2010 | McIlrath |
| 2010/0044846 | A1 | 2/2010 | Ohmi et al. |
| 2010/0059869 | A1 | 3/2010 | Kaskoun et al. |
| 2010/0332193 | A1 | 12/2010 | Hu et al. |
| 2011/0016446 | A1 | 1/2011 | Krebd |
| 2011/0032130 | A1 | 2/2011 | Ludwig |
| 2011/0121811 | A1 | 5/2011 | Dennard et al. |

OTHER PUBLICATIONS

Chan et al., "A Resonant Global Clock Distribution for the Cell Broadband Engine Processor" IEEE J. Solid State Circuits, vol. 44, No. 1, pp. 64-72, Jan. 2009.

Gutnik et al., "Active GHz Clock Network Using Distributed PLLs" IEEE JSSC, vol. 35, No. 11, pp. 1553-1560, Nov. 2000.

Lam et al., "Power supply noise suppression via clock skew scheduling," in Proceedings of International Symposium on Quality Electronic Design, pp. 355-360, Mar. 2002.

Miura et al., "A 2.7Gb/s/mm2 0.9pj/b/Chip 1Coil/Channel ThruChip Interface with Coupled-Resonator-Based CDR for NAND Flash Memory Stacking," ISSCC, pp. 490-491, Feb. 2011.

Pavlidis et al., "Clock distribution networks for 3-D integrated Circuits", IEEE CICC, pp. 651-654, Sep. 2008.

Restle et al., "A Clock Distribution Method for Microprocessors", IEEE JSSC, vol. 36, No. 5, pp. 792-799, May 2001.

Tam et al., "Clock Generation and distribution for the first IA-64 Microprocessor", IEEE JSSC vol. 35, No. 11, pp. 1545-1552, Nov. 2000.

* cited by examiner

SYNCHRONIZING GLOBAL CLOCKS IN 3D STACKS OF INTEGRATED CIRCUITS BY SHORTING THE CLOCK NETWORK

GOVERNMENT RIGHTS

This invention was made with Government support under Contract No.: H98230-07-C-0409 (National Security Agency). The Government has certain rights in this invention.

CROSS-REFERENCE TO RELATED APPLICATIONS

This application is related to the following commonly assigned applications, all filed on Aug. 25, 2011 and incorporated herein by reference: U.S. patent application Ser. No. 13/217,734, entitled "PROGRAMMING THE BEHAVIOR OF INDIVIDUAL CHIPS OR STRATA IN A 3D STACK OF INTEGRATED CIRCUITS"; U.S. patent application Ser. No. 13/217,349, entitled "3D CHIP STACK SKEW REDUCTION WITH RESONANT CLOCK AND INDUCTIVE COUPLING"; U.S. patent application Ser. No. 13/217,767, entitled "3D INTEGRATED CIRCUIT STACK-WIDE SYNCHRONIZATION CIRCUIT"; U.S. patent application Ser. No. 13/217,789, entitled "CONFIGURATION OF CONNECTIONS IN A 3D STACK OF INTEGRATED CIRCUITS"; U.S. patent application Ser. No. 13/217,381, entitled "3D INTER-STRATUM CONNECTIVITY ROBUSTNESS"; U.S. patent application No. 13/217,406, entitled "AC SUPPLY NOISE REDUCTION IN A 3D STACK WITH VOLTAGE SENSING AND CLOCK SHIFTING"; U.S. patent application Ser. No. 13/217,429, entitled "VERTICAL POWER BUDGETING AND SHIFTING FOR 3D INTEGRATION".

BACKGROUND

1. Technical Field

The present invention relates generally to integrated circuits and, in particular, to synchronizing global clocks in 3D stacks of integrated circuits by shorting the clock network.

2. Description of the Related Art

A three-dimensional (3D) stacked chip includes two or more electronic integrated circuit chips (referred to as strata or stratum) stacked one on top of the other. The strata are connected to each other with inter-strata interconnects that could use C4 or other technology, and the strata could include through-Silicon vias (TSVs) to connect from the front side to the back side of the strata. The strata could be stacked face-to-face or face-to-back where the active electronics can be on any of the "face" or "back" sides of a particular stratum.

However, the synchronization of a global clock for the stacked chip poses a number of problems. These problems relate to a set of constraints that should be imposed on the synchronization. The set of constraints include, but are not limited to, the following: strata must be testable at the target clock frequency before stacking; inter-stratum and within stratum skews must be small, similar to 2D chip; low power and area overheads; robust to all sources of variations including process, voltage, temperature and functional yield; applicable to both grid and non-grid clock network; and compatible with voltage and frequency scaling where the supply voltage and the frequency of the 3D stacked chip is changed during operations to optimize performance.

SUMMARY

According to an aspect of the present principles, there is provided a clock distribution network for synchronizing global clock signals within a 3D chip stack having two or more strata. On each of the two or more strata, the clock distribution network includes a clock grid having a plurality of sectors for providing the global clock signals to various chip locations, a multiple-level buffered clock tree for driving the clock grid and including at least a root and a plurality of clock buffers, and one or more multiplexers for providing the global clock signals to at least a portion of the buffered clock tree. Inputs of at least some of the plurality of clock buffers on each of the two or more strata are shorted together using chip-to-chip interconnects to reduce skewing of the global clock signals with respect to the various chip locations.

According to another aspect of the present principles, there is provided a method for synchronizing global clock signals within a 3D chip having two or more strata. The method includes providing, on each of the two or more strata, a clock grid having a plurality of sectors for providing the global clock signals to various chip locations, a multiple-level buffered clock tree for driving the clock grid and including at least a root and a plurality of clock buffers, and one or more multiplexers for providing the global clock signals to at least a portion of the buffered clock tree. The method further includes shorting together inputs of at least some of the plurality of clock buffers on each of the two or more strata using chip-to-chip interconnects to reduce skewing of the global clock signals with respect to the various chip locations.

According to another aspect of the present principles, there is provided a clock distribution network for synchronizing global clock signals within a 3D chip stack having two or more strata including a master stratum and non-master strata. On each of the two or more strata, the clock distribution network includes a clock grid and a multiple-level buffered clock tree. The clock grid has a plurality of sectors for providing the global clock signals to various chip locations. The multiple-level buffered clock tree has a plurality of sector clock buffers for driving the plurality of sectors, a plurality of relay clock buffers for distributing the global clock signals to the plurality of sector clock buffers, and one or more multiplexers for providing the global clock signals to at least a portion of the buffered clock tree. The one or more multiplexers on the master stratum drive the one or more multiplexers on all of the non-master strata.

According to still another aspect of the present principles, there is provided a method for synchronizing global clock signals within a 3D chip stack having two or more strata. The method includes providing, on each of the two or more strata, a clock grid and multiple-level buffered clock tree. The clock grid has a plurality of sectors for providing the global clock signals to various chip locations. The multiple-level buffered clock tree has a plurality of sector clock buffers for driving the plurality of sectors, a plurality of relay clock buffers for distributing the global clock signals to the plurality of sector clock buffers, and one or more multiplexers for providing the global clock signals to at least a portion of the buffered clock tree. The method further includes driving the one or more multiplexers on all of the non-master strata using the one or more multiplexers on the master stratum.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to synchronizing the global clocks in 3D stacks of integrated circuits by shorting the clock network.

Figure 1:
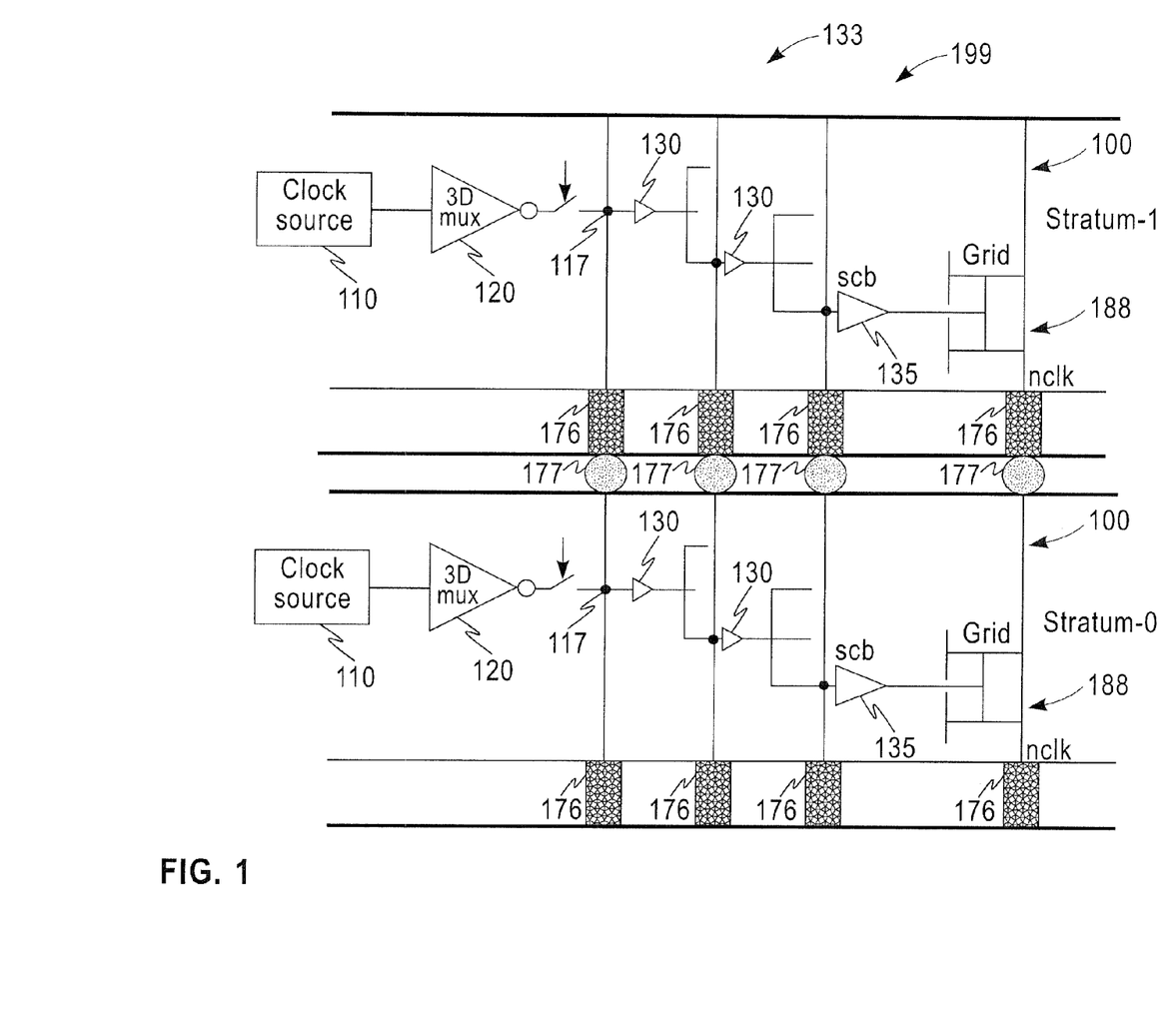
FIG. 1 shows a clock distribution network 133 for a 3D chip stack 199, in accordance with an embodiment of the present principles.

FIG. 1 shows a clock distribution network 133 for a 3D chip stack 199, in accordance with an embodiment of the present principles. The clock distribution network 133 includes shorted clock trees 100. Each stratum of the stack 199 includes a respective one of the shorted clock trees 100. Stack 199 includes a stratum-0 and a stratum-1.

The shorted clock trees 100 have a single clock source 110 (e.g., a phase locked loop (PLL)), selectable using a 3D mux 120, for driving the root 117 of the clock trees in all strata. Clock buffers 130 on all strata are shorted together using through-Silicon vias (TSVs) 176 and micro C4 connections (μC4) 177. Inputs of the clock buffers 130 in the trees 100 are shorted, and uniform shorting is applied over the entire final clock mesh (nclk) 188. We note that the "final clock mesh" is interchangeably referred to herein as "final clock grid" as well as "nclk" and, hence, all are denoted by the reference numeral 188.

It is to be appreciated that a set of 3D muxes can also be placed further up the clock tree, at the input to all the relay buffers or sector buffers at the same level of the clock tree instead of placing one 3D mux at the root of the clock tree. The 3D muxes on 1 stratum will then drive the 3D muxes in the other strata which will, in turn, drive the clock tree of that stratum. When the 3D mux is located at the input to the sector buffer, we call that a muxable sector buffer. The same buffer levels in the part of the clock tree from the 3D muxes to the clock grid can be shorted between strata.

The trees 100 provide a low skew and permits testing of individual strata before bonding. The trees 100 should have the same clock frequency in each stratum. The size of the 3D mux 120 scales with number of strata. Dissimilar clock loads and different chip areas in each stratum will cause the skew to increase due to such variations. Inputs rather than outputs of clock buffers 130 in the trees 100 are shorted to avoid strong short-circuit currents and waveform deformation. We note that reducing the amount of inter-stratum shorting will increase the amount of clock skew.

Not shorting the final clock mesh 188 (shorting all other levels of the clock trees) between strata reduces within-stratum local skew at the cost of increased stratum-to-stratum skew. Not shorting the inputs to all sector buffers 135 (shorting all other levels of the clock trees 100 including the final clock mesh 188) will reduce the number of shorting points (TSV and μC4 overheads) significantly (by around 30%) at the cost of a small increase in clock skew. Redundant TSV/μC4 176/177 is added at the corners and edges of the chip or in areas with existing high within-stratum skew to improve robustness as these areas are more sensitive to TSV/uC4 yield. If possible, strata of the same corner are stacked to reduce skew. We note that a number of sector buffers are uniformly distributed over the clock mesh and used to drive the final clock mesh 188 and each sector buffer is placed in the middle of a small rectangular area of the mesh called a clock sector, while a relay buffer (or simply "buffer" in short) 130 is primarily used to relay and/or otherwise distribute the clock signal throughout the chip with the same latency in order to drive the inputs of all the sector buffers in a synchronous manner.

Figure 12:
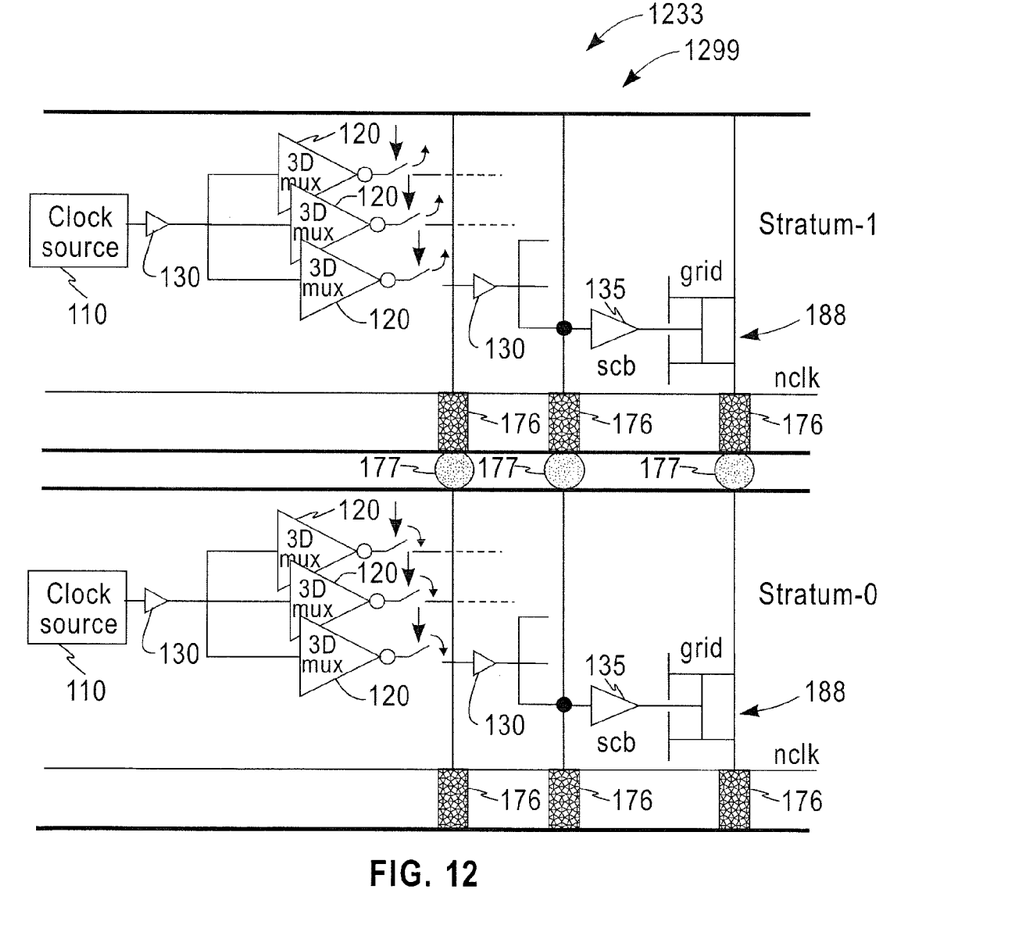
FIG. 12 shows a clock distribution network 1233 for a 3D chip stack 1299, in accordance with another embodiment of the present principles.

FIG. 12 shows a clock distribution network 1233 for a 3D chip stack 1299, in accordance with another embodiment of the present principles. As compared to FIG. 1, the 3D muxes 120 in FIG. 12 are moved higher up the buffering level. In such a case, stratum-0 can be used to drive both stratum-1 and stratum-0 from this buffer level onwards. After the 3D mux 120, the respective inputs to all relay buffers 130 and sector buffers 135 are shorted between strata. In the case where the final clock mesh has the same frequency (no divider, as shown and described with respect to FIG. 3), the final clock mesh is shorted between strata.

Figure 2:
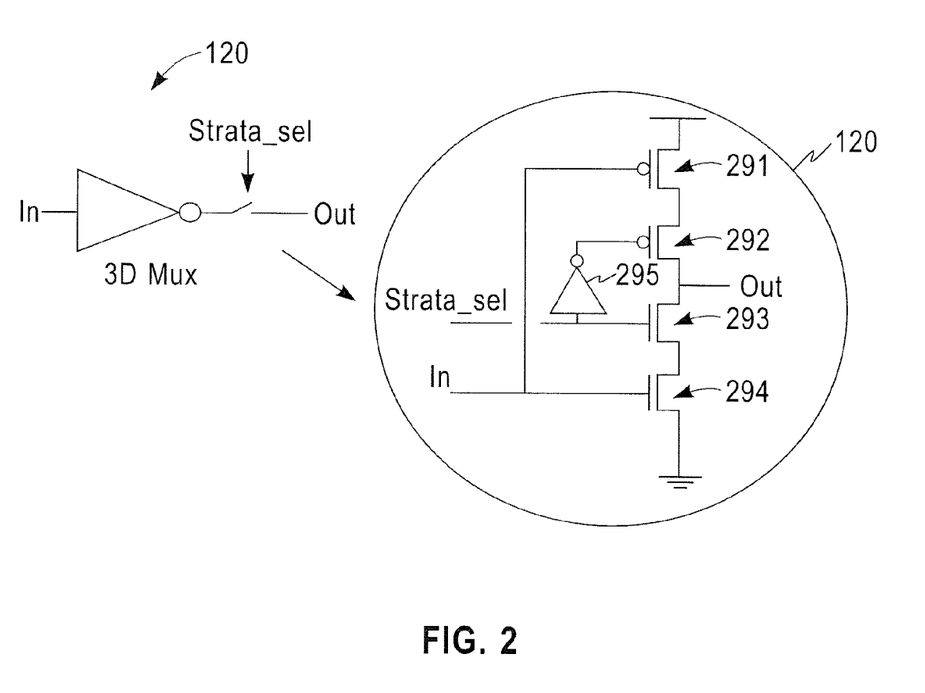
FIG. 2 further shows the 3D multiplexer 120 of FIG. 1 or 12, in accordance with an embodiment of the present principles.

FIG. 2 further shows the 3D multiplexer 120 of FIG. 1, in accordance with an embodiment of the present principles. The 3D multiplexer 120 is a tri-state multiplexor that is sized appropriately to drive all the strata in the stack. Its drive strength can be made programmable so that it can have the right drive for testing before stacking or when it is stacked with a variable number of strata. The multiplexer 200 includes two p-channel MOSFETs 291 and 292, two n-channel MOSFETS 293 and 294, and an inverter 295. The source of MOSFET 291 is connected in signal communication with a voltage or current source. The drain of MOSFET 291 is connected in signal communication with the source of MOSFET 292. The source of MOSFET 294 is connected in signal communication with ground. The drain of MOSFET 294 is connected in signal communication with the source of MOSFET 293. An output of the inverter 295 is connected in signal communication with the gate of the MOSFET 292. The drains of MOSFETs 292 and 293 are available as outputs of the 3D multiplexer 120, for providing an output signal ("out"). The gates of the MOSFETS 291 and 294 are available as inputs of the 3D multiplexer 120, for receiving an input signal ("in").

The gate of MOSFET 293 and an input of inverter 295 are available as inputs of the 3D multiplexer 120, for receiving a control signal ("strata_sel").

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

It is to be further appreciated that while one or more embodiments described herein may refer to the use of Silicon with respect to a chip or a through via, the present principles are not limited to using only chips or vias made from Silicon and, thus, chips or vias made from other materials including but not limited to Germanium and Gallium Arsenide may also be used in accordance with the present principles while maintaining the spirit of the present principles. Moreover, it is to be further appreciated that while one or more embodiments described herein may refer to the use of C4 or micro C4 (uC4) connections, the present principles are not limited to solely using C4 or micro C4 connections and, thus, other types of connections may also be used while maintaining the spirit of the present principles. The same applies for the through-Silicon vias described herein. Hence, examples of other chip-to-chip connections that may be used in stacked chips include micro-pillars, inductive coupling, and capacitive coupling.

It is to be understood that the present invention will be described in terms of a given illustrative architecture having a wafer; however, other architectures, structures, substrate materials and process features and steps may be varied within the scope of the present invention.

It will also be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 3:
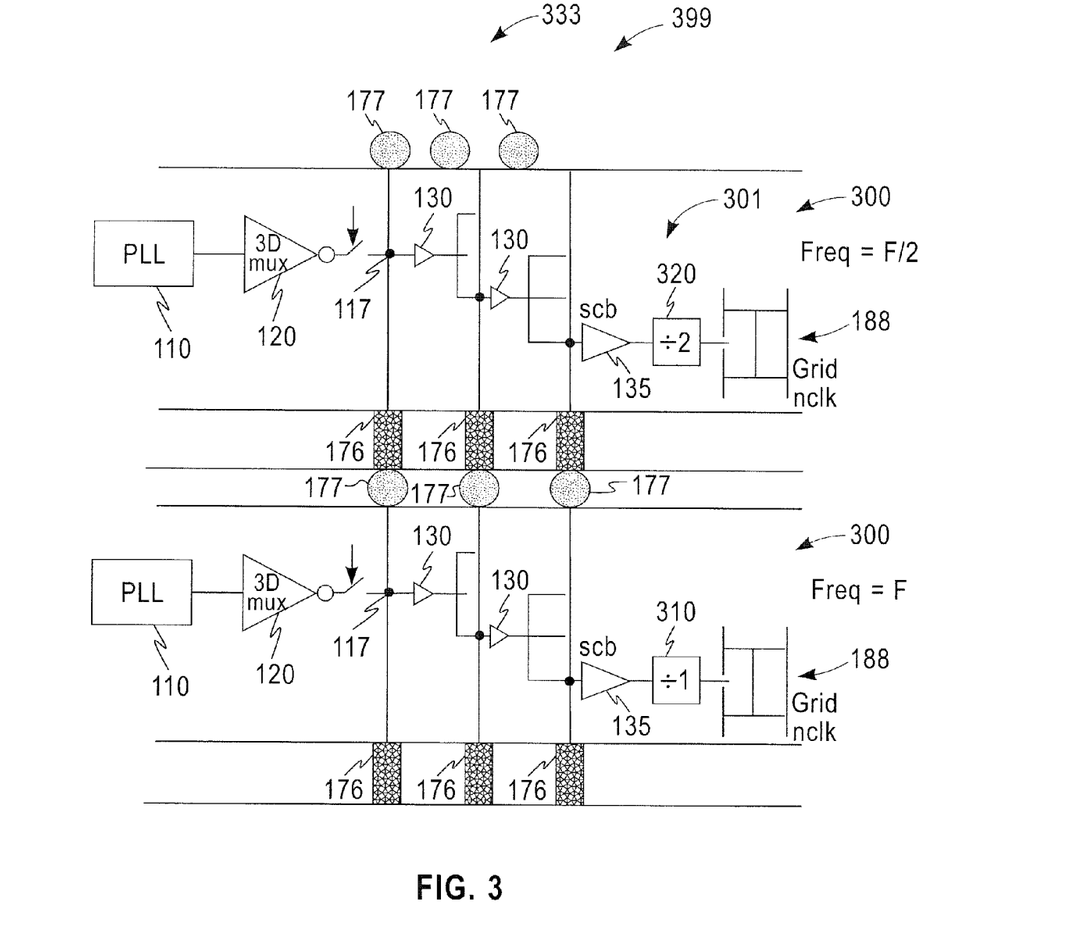
FIG. 3 shows a clock distribution network 333 with local clock dividers 301 for a 3D chip stack 399, in accordance with an embodiment of the present principles.

FIG. 3 shows a clock distribution network 333 with local clock dividers 301 for a 3D chip stack 399, in accordance with an embodiment of the present principles. In particular, the local clock dividers 301 are located within or at the end of the clock trees 300 of the clock distribution network 333. The local clock dividers 301 allows for different frequencies on the stacked strata. The approach is to distribute a global clock to all of the strata and use the local clock dividers 301 to generate the lower frequency clocks. The local clock dividers 301 include a dummy delay element 310 and a divide-by-two circuit 320. The dummy delay element 310 has a delay that is matched to the delay provided by the divide-by-two circuit 320. The dividers can be placed before or after the sector buffers (scb). The dividers 301 can also be placed further down the clock tree towards the root 117 of the tree 300 at the input of the relay buffers 130. In all cases, the levels of the clock tree 300 after the divider 301 and the final clock grid 188 cannot be shorted between strata since the clock frequency is no longer the same. That is, the clock network 333 between strata can only be shorted before and up to the inputs to the dividers 301. After the dividers 301, the signal frequency will be different.

Figure 4:
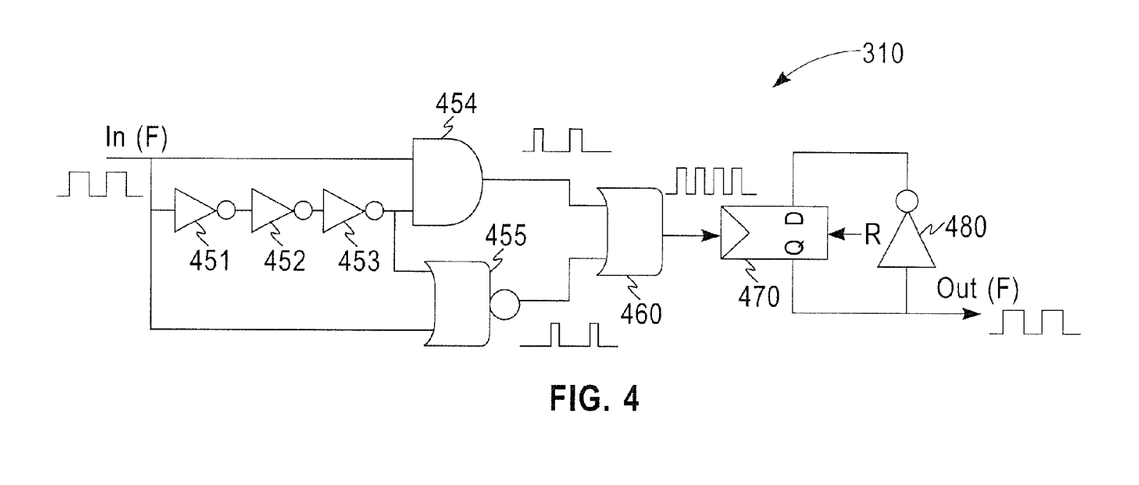
FIG. 4 further shows the dummy delay element 310 of FIG. 3, in accordance with an embodiment of the present principles.

FIG. 4 further shows the dummy delay element 310 of FIG. 3, in accordance with an embodiment of the present principles. The dummy delay element 310 does not divide the input frequency by two but provides a delay that matches the divide-by-two circuit 320. The dummy delay element 310 includes three delay elements 451, 452, and 453 serially connected. An output of delay element 453 is connected in signal communication with a first input of an AND gate 454 and with a second input of a NOR gate 455. An output of the AND gate 454 and an output of the NOR gate 455 are connected in signal communication with a first input and a second input, respectively, of an OR gate 460. An output of the OR gate 460 is connected in signal communication with a clock input of a (pulse-triggered or rising edge or falling edge triggered) latch 470. A D input of the latch 470 is connected in signal communication with an output of an inverter 480. A Q output of the latch 470 is connected in signal communication with an input of the inverter 480. The Q output of the latch 470 is also available as an output of the dummy delay element 310. A second input of the AND gate 454, an input of the delay element 451, and a first input of the OR gate 455 are available as inputs of the dummy delay element 310. A global reset signal will ensure that all the latches 470 store the same initial value and are triggered at the same time.

Figure 5:
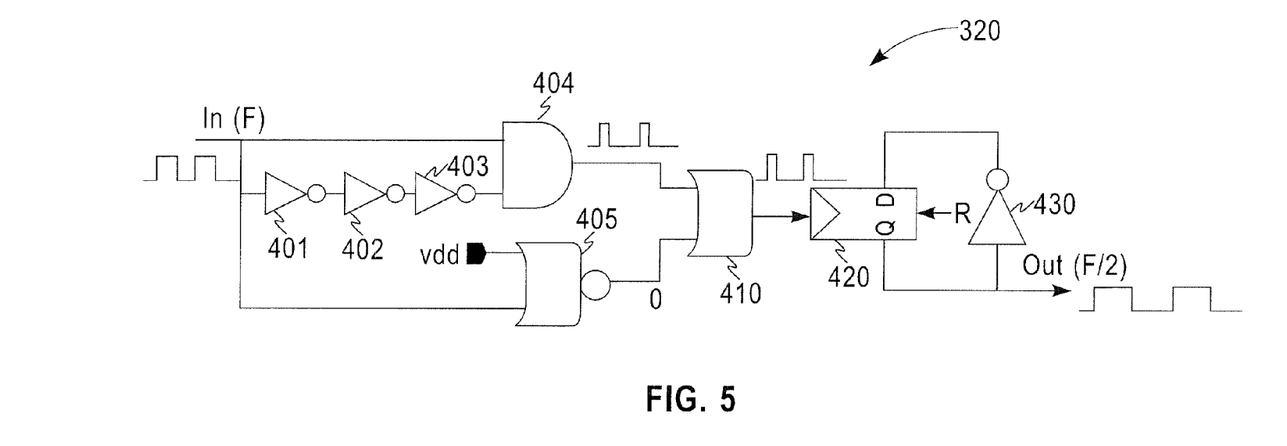
FIG. 5 further shows the divide-by-two circuit 320 of FIG. 3, in accordance with an embodiment of the present principles.

FIG. 5 further shows the divide-by-two circuit 320 of FIG. 3, in accordance with an embodiment of the present principles. The divide-by-two circuit 320 includes three delay elements 401, 402, and 403 serially connected. An output of delay element 403 is connected in signal communication with a first input of an AND gate 404. An output of the AND gate 404 and an output of a NOR gate 405 are connected in signal communication with a first input and a second input, respectively, of an OR gate 410. An output of the OR gate 410 is connected in signal communication with a clock input of a latch 420. A D input of the latch 420 is connected in signal communication with an output of an inverter 430. A Q output of the latch 420 is connected in signal communication with an input of the inverter 430. The Q output of the latch 420 is also available as an output of the divide-by-two circuit 320. A second input of the AND gate 404, an input of the delay element 401, and a first input of the NOR gate 405 are available as inputs of the divide-by-two circuit 320. A second input of the NOR gate 405 is connected to a supply vdd.

We note that while the local clock dividers described herein include a divide-by-two circuit and a dummy circuit intended to provide a delay matched to that provided by the divide-by-two circuit, the present principles are not limited to solely clock division by the integer 2 and, thus, other values may also be used, while maintaining the spirit of the present principles.

Figure 6:
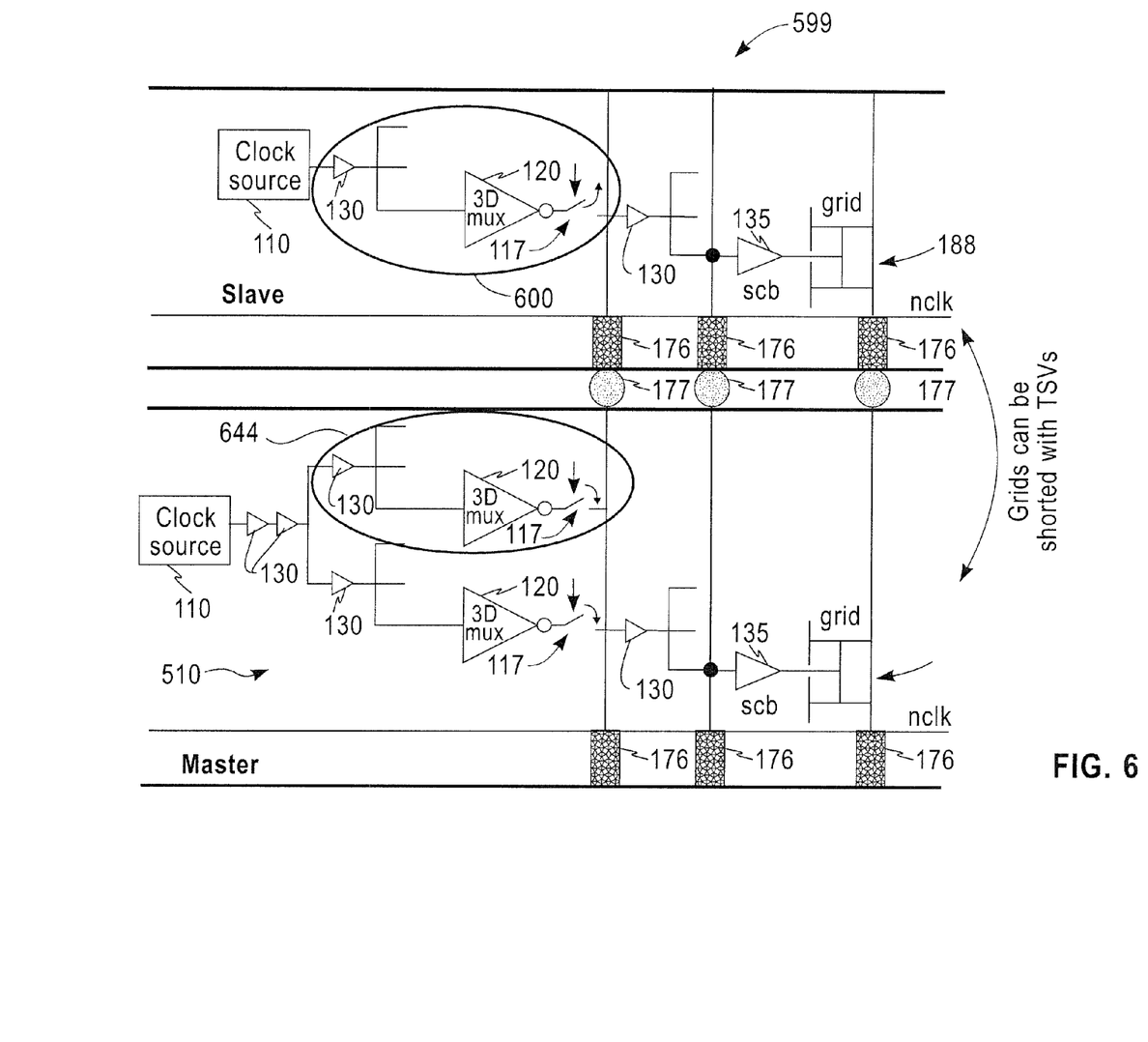
FIG. 6 shows a tree replication 644 by a master stratum 510, in accordance with an embodiment of the present principles.

A description will now be given regarding the master stratum replicating all trees, in accordance with an embodiment of the present principles. FIG. 6 shows a tree replication 644 by a master stratum 510 in a 3D stack 599, in accordance with an embodiment of the present principles. 3D muxes 120 in all strata have the same size. The partial clock trees 600 of the different strata can be replicated on one master stratum 510 and used to drive the tri-state node 117 at the output of the 3D muxes 120 of all strata. In this case, each 3D mux 120 is sized to drive only the last buffer stage and TSV/uC4 176/177. Differences in the load seen by the bidirectional node 117 of the 3D mux 120 before and after stacking do not affect the skew. The tree replication 644 allows for different clock loads and chip areas in each stratum.

Figure 11:
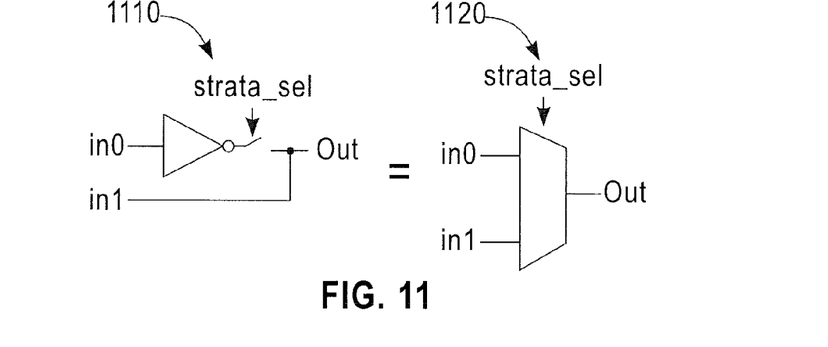
FIG. 11 shows the correlation between a tri-state 3D multiplexer 1110 and a static CMOS 2:1 3D multiplexer 1120, in accordance with an embodiment of the present principles.

FIG. 11 shows the correlation between a tri-state 3D multiplexer 1110 and a static CMOS 2:1 3D multiplexer 1120, in accordance with an embodiment of the present principles. The tri-state mux 1110 allows for selection of any stratum to drive the others. Moreover, only one TSV link is required for a tri-state mux 1110. Regarding the static mux 1120, to allow the selection of any stratum to drive the others will require the following: the number of mux inputs=the number of strata=the number of TSV links. However, a 2-input static mux is generally smaller than a tri-state mux. Further, there are no issues with the floating (tri-state) node at startup. The tri-state node can be floating at a non-determined voltage level at startup which can cause reliability issues. Thus, in accordance with an embodiment of the present principles, using a fixed master stratum to drive the clock-tree of all other strata allows for the use of a 2-input static mux 1120.

Figure 7:
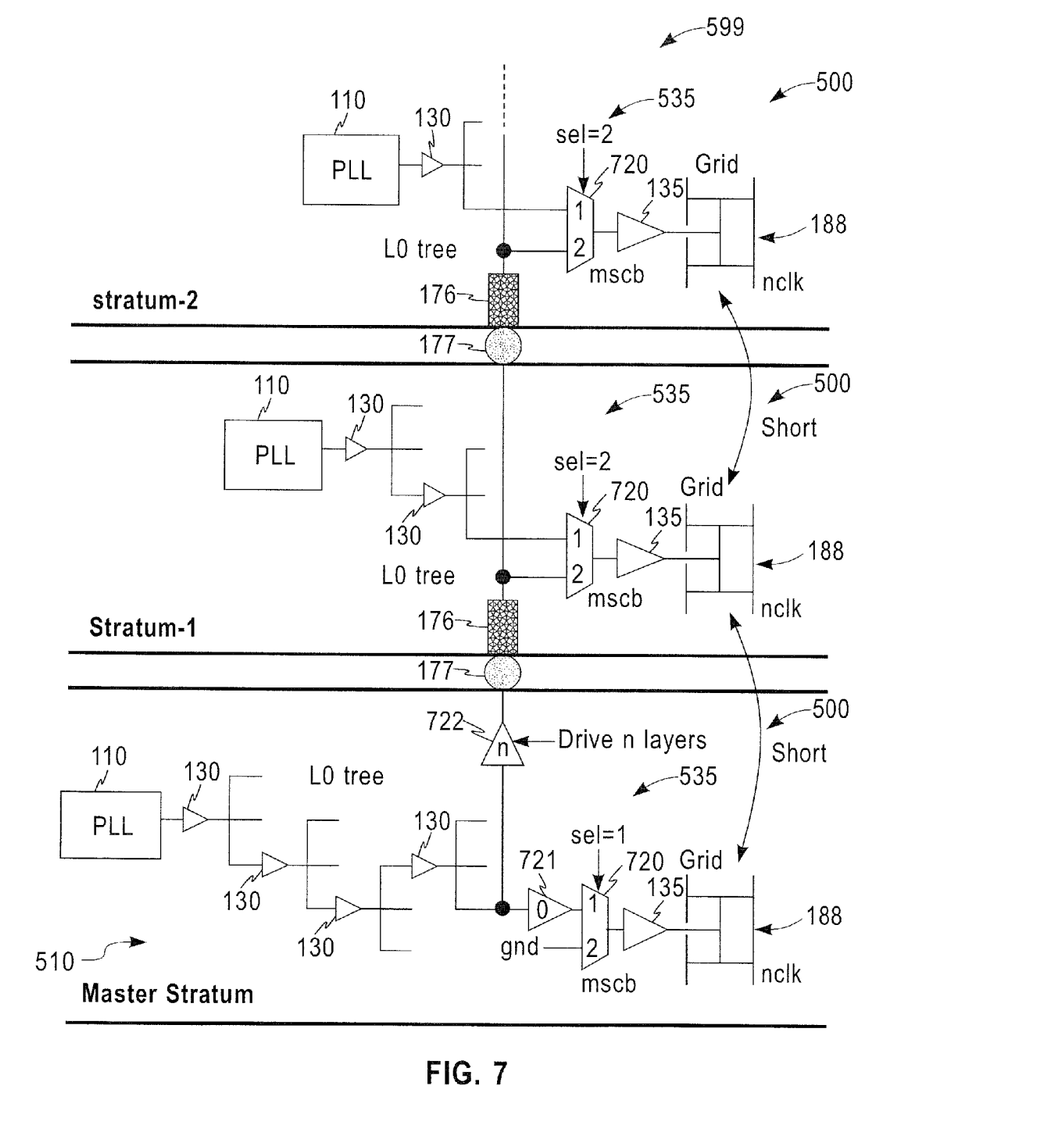
FIG. 7 shows the master stratum 510 driving all strata, in accordance with an embodiment of the present principles.

FIG. 7 shows the master stratum 510 of FIG. 6 driving all strata, in accordance with an embodiment of the present principles. The multiplexor here uses a static 2-input mux 720 instead of a tri-state 3D mux. Master stratum 510 includes 2 additional buffers, namely buffer-0 721 and buffer-n 722. Buffer-n 722 can be programmed to drive 1-n strata above the master stratum 510 with the same delay as buffer-0 721. The static mux on the master stratum 510 is used to generate the same delay as the static mux of other strata. Strata 1 to n include the static mux without buffer-0 721 and buffer-n 722. The delay from the inputs of buffers-0 721 and buffers-n 722 to the clk grid 188 will be the same for all strata. The clock grid 188 can be shorted to reduce skew further. The approach shown in FIG. 7 is for stacking chips with different clock trees, clock loads and chip areas. Although FIG. 7 shows the static mux placed at the input of the sector buffers, it can be moved further away from the clock grid 188 to the relay buffer levels. In all cases, the clock network between strata on levels after the static muxes 720 can be shorted together to reduce skew if the clock frequencies are the same on the strata. The static mux 720 can also be replaced by a tri-state mux.

Figure 8:
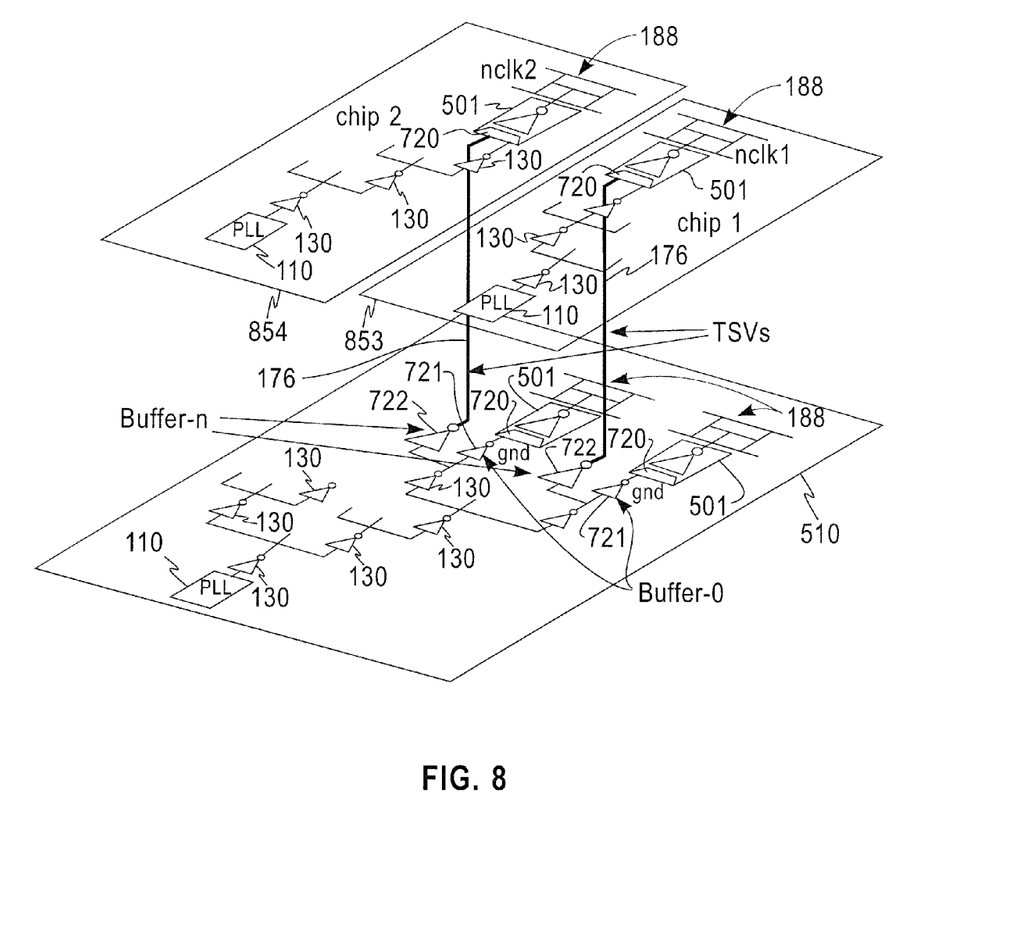
FIG. 8 further shows the master stratum 510, in accordance with an embodiment of the present principles.

FIG. 8 further shows the master stratum 510, in accordance with an embodiment of the present principles. The approach in accordance with the present principles relating to a master stratum as described here can be used for 1-1 stacks or an active Silicon carrier master stratum that has several chip stacks spread over it. The master stratum configuration as disclosed herein provides a low skew even if the stacked chips 853 and 854 do not cover all of the master stratum 510 since the delays of shorted and non-shorted clock buffers are equalized.

When stacked, the multiplexors 720 in the strata stacked on top of the master stratum 510 can choose to relay a clock signal to the clock grid 188 that they respectively drive by choosing to be driven by the master stratum 510. Alternatively, the multiplexers 720 can choose to disable the clock grid 188 that they respectively drive by choosing to be driven by the clock driver from its own stratum which will be in a fixed voltage level since the clock source (PLL) 110 in its stratum will be disabled and the output fixed at either the power supply voltage or at ground voltage.

Figure 9:
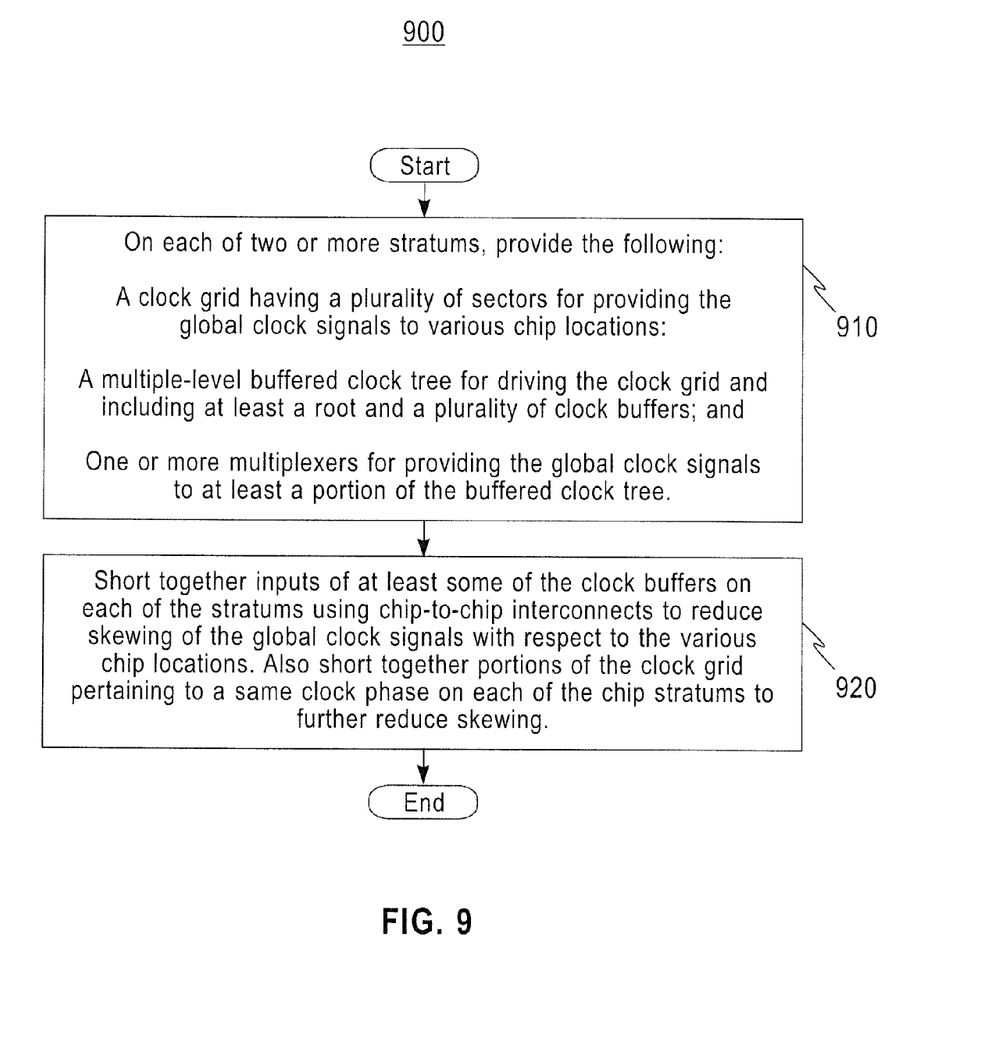
FIG. 9 shows a method 900 for synchronizing global clock signals within a 3D chip stack that includes two or more strata, in accordance with an embodiment of the present principles.

FIG. 9 shows a method 900 for synchronizing global clock signals within a 3D chip stack that includes two or more strata, in accordance with an embodiment of the present principles.

At step 910, on each of the two or more strata, the following is provided: a clock grid having a plurality of sectors for providing the global clock signals to various chip locations; a multiple-level buffered clock tree for driving the clock grid and including at least a root and a plurality of clock buffers; and one or more multiplexers for providing the global clock signals to at least a portion of the buffered clock tree.

At step 920, inputs of at least some of the plurality of clock buffers on each of the two or more strata are shorted together using chip-to-chip interconnects to reduce skewing of the global clock signals with respect to the various chip locations. Moreover, portions of the clock grid pertaining to a same clock phase on each of the two or more strata are shorted together to further reduce skewing.

Figure 10:
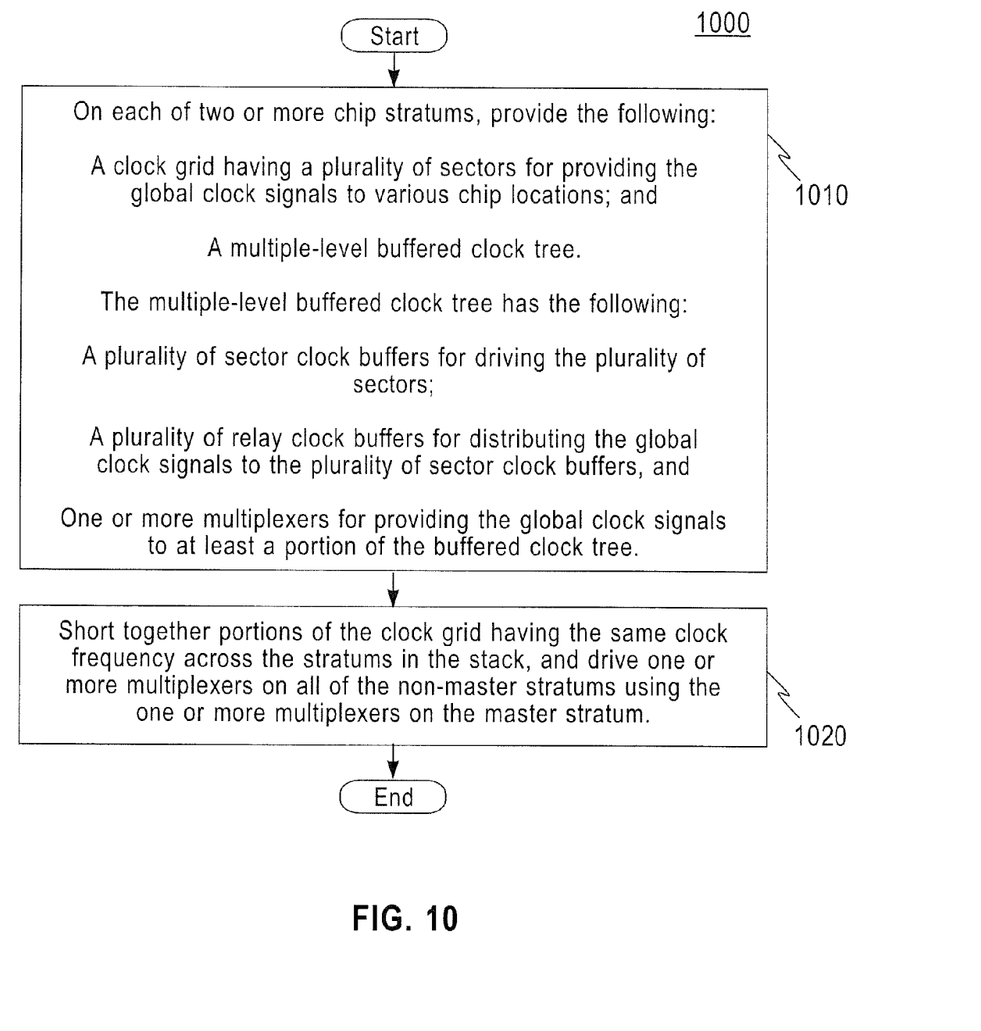
FIG. 10 shows another method 1000 for synchronizing global clock signals within a 3D chip stack that includes two or more strata, in accordance with an embodiment of the present principles.

FIG. 10 shows another method 1000 for synchronizing global clock signals within a 3D chip stack that includes two or more strata, in accordance with an embodiment of the present principles.

At step 1010, on each of the two or more strata, the following is provided: a clock grid having a plurality of sectors for providing the global clock signals to various chip locations; and a multiple-level buffered clock tree. The multiple-level buffered clock tree has a plurality of sector clock buffers for driving the plurality of sectors, a plurality of relay clock buffers for distributing the global clock signals to the plurality of sector clock buffers, and one or more multiplexers for providing the global clock signals to at least a portion of the buffered clock tree.

At step 1020, portions of the grid having the same clock frequency are shorted together across the strata in the stack using chip-to-chip interconnections, and the one or more multiplexers on all of the non-master strata are driven using the one or more multiplexers on the master stratum.

A description will now be given regarding non-grid global clocks (lower performance ASICs). Regarding lower frequency ASICs with lower skew requirements, clock pins of the same can be driven by a buffer tree with each branch timed in simulations to have the same latency. If the non-grid global clocks are stacked on a chip with the same clock network, then short inputs to all clock buffers. If the non-grid global clocks are stacked on a stratum with different clock network, then add a multiplexer to the inputs of the last buffer, and drive the stratum with a master stratum that replicates the stratum's clock network. The multiplexers can be placed further down the clock buffer levels closer to the root of the clock tree. In that case, the inputs to the clock buffers in the levels after the multiplexers can be shorted together to reduce skew.

A description will now be given regarding some of the many attendant advantages of the present principles. The present principles provide a very low skew global clock across all strata in the stack. To that end, the inter-stratum skew is averaged through clock TSVs, and simulations show a skew of <10 ps when the entire clock tree is shorted.

Moreover, the present principles consume low power and have low area overheads. To that end, one TSV per clock tree buffer input and per clock sector mesh is needed for a fully shorted clock tree. Further to that end, for good load and corner matched chips, ideally no current should flow through the clock TSVs when they are fully shorted and driven by buffers on both strata.

Also, the present principles permit testing of individual strata before bonding. We note that the preceding testing advantage improves yield, and allows for corner matching.

Additionally, the present principles allow for different frequencies, clock loads and chip areas for the strata in a 3D stack. To that end, the present principles use multiplexers, dividers and dummy dividers.

Further, the present principles permit voltage and frequency scaling.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A clock distribution network for synchronizing global clock signals within a 3D chip stack having two or more strata, the clock distribution network comprising:
   on each of the two or more strata,
      a clock grid having a plurality of sectors for providing the global clock signals to various chip locations;
      a multiple-level buffered clock tree for driving the clock grid and including at least a root and a plurality of clock buffers; and
      one or more multiplexers for providing the global clock signals to at least a portion of the buffered clock tree;
      wherein inputs of at least some of the plurality of clock buffers on each of the two or more strata are shorted together using chip-to-chip interconnects to reduce skewing of the global clock signals with respect to the various chip locations.

2. The clock distribution network of claim 1, wherein the plurality of clock buffers comprise a plurality of sector clock buffers for driving the plurality of sectors and a plurality of relay clock buffers for distributing the global clock signals to the plurality of sector clock buffers.

3. The clock distribution network of claim 2, wherein the buffered clock tree on a given one of the two or more strata comprises a local clock divider for dividing the global clock signals provided to at least one of the plurality of relay clock buffers, at least one of the plurality of sector clock buffers, or at least one of the plurality of sectors.

4. The clock distribution network of claim 3, wherein the buffered clock tree on a different stratum with respect to the given one of the two or more strata comprises another local clock divider for dividing the global clock signals provided to at least one of the plurality of relay clock buffers, at least one of the plurality of sector clock buffers, or at least one of the plurality of sectors on the different stratum, and wherein the local clock divider comprises a divide-by-X circuit and the other local clock divider comprises a dummy delay circuit having a delay matched to that provided by the divide-by-X circuit, where X is an integer equal to or greater than one.

5. The clock distribution network of claim 1, wherein each of the one or more multiplexers provides respective ones of the global clock signals having a same phase or provides a same single clock source to the root on each of the two or more strata.

6. The clock distribution network of claim 1, wherein the clock grid on each of the two or more strata is shorted.

7. The clock distribution network of claim 1, wherein the plurality of multiplexers comprise at least one tri-state multiplexer or at least one static multiplexer.

8. A method for synchronizing global clock signals within a 3D chip stack having two or more strata, the method comprising:
   providing on each of the two or more strata,
      a clock grid having a plurality of sectors for providing the global clock signals to various chip locations;
      a multiple-level buffered clock tree for driving the clock grid and including at least a root and a plurality of clock buffers; and
      one or more multiplexers for providing the global clock signals to at least a portion of the buffered clock tree;
   shorting together inputs of at least some of the plurality of clock buffers on each of the two or more strata using chip-to-chip interconnects to reduce skewing of the global clock signals with respect to the various chip locations.

9. The method of claim 8, further comprising shorting the clock grid on each of the two or more strata.

10. The method of claim 8, wherein only the inputs of the at least some of the plurality of clock buffers distributing the clock signals of a same phase are shorted together.

11. A clock distribution network for synchronizing global clock signals within a 3D chip stack having two or more strata including a master stratum and non-master strata, the clock distribution network comprising:
   on each of the two or more strata,
      a clock grid having a plurality of sectors for providing the global clock signals to various chip locations;
      a multiple-level buffered clock tree having a plurality of sector clock buffers for driving the plurality of sectors, a plurality of relay clock buffers for distributing the global clock signals to the plurality of sector clock buffers, and one or more multiplexers for providing the global clock signals to at least a portion of the buffered clock tree; and
   wherein the one or more multiplexers on the master stratum drive the one or more multiplexers on all of the non-master strata.

12. The clock distribution network of claim 11, wherein the master stratum is selectable.

13. The clock distribution network of claim 12, wherein each of the one or more multiplexers on the master stratum is configured to drive a same number of strata.

14. The clock distribution network of claim 11, wherein the one or more multiplexers comprise at least one tri-state multiplexer.

15. The clock distribution network of claim 14, wherein the at least one tri-state multiplexer on the master stratum is configured to drive all of the one or more multiplexers on all of the non-master strata.

16. The clock distribution network of claim 11, wherein portions of the clock grid on each of the two or more strata are shorted using chip-to-chip interconnects.

17. The clock distribution network of claim 11, wherein the master stratum is fixed, and each of the one or more multiplexers comprises a static CMOS multiplexer having two inputs and a single output.

18. The clock distribution network of claim 17, wherein portions of the buffered clock tree on at least one of the non-master strata are replicated on the master stratum and used to drive the one or more multiplexers on all of the non-master strata.

19. The clock distribution network of claim 11, wherein the master stratum includes two additional relay clock buffers in relation to the non-master strata, a first one of the two additional relay clock buffers being connected to one of the two inputs of the static CMOS multiplexer, a second one of the two additional relay clock buffers being connected to an input of the first one of the two additional relay clock buffers and being programmable for driving the non-master strata with a same delay as that provided by the first one of the two additional relay clock buffers.

20. A method for synchronizing global clock signals within a 3D chip stack having two or more strata, the method comprising:
    providing on each of the two or more strata,
        a clock grid having a plurality of sectors for providing the global clock signals to various chip locations;
        a multiple-level buffered clock tree having a plurality of sector clock buffers for driving the plurality of sectors, a plurality of relay clock buffers for distributing the global clock signals to the plurality of sector clock buffers, and one or more multiplexers for providing the global clock signals to at least a portion of the buffered clock tree; and
    driving the one or more multiplexers on all of the non-master strata using the one or more multiplexers on the master stratum.

21. The method of claim 20, wherein the master stratum is selectable.

22. The method of claim 21, wherein said driving step comprises configuring the one or more multiplexers in each of the two or more strata to drive a same number of strata.

23. The method of claim 20, wherein the one or more multiplexers comprise at least one tri-state multiplexer.

24. The method of claim 23, wherein said driving step comprises configuring the at least one tri-state multiplexer on the master stratum to drive all of the one or more multiplexers on all of the non-master strata.

25. The method of claim 20, further comprising shorting portions of the clock grid on each of the two or more strata using chip-to-chip interconnects.

\* \* \* \* \*